(12) United States Patent
Shih et al.

(10) Patent No.: US 8,962,375 B2
(45) Date of Patent: Feb. 24, 2015

(54) METHOD OF MAKING A REFLECTIVE SHIELD

(71) Applicant: Taiwan Semiconductor Manufacturing Company, Ltd., Hsinchu (TW)

(72) Inventors: Yu-Hao Shih, Yongkang (TW); Szu-Ying Chen, Taichung (TW); Hsing-Lung Chen, Kaohsiung (TW); Jen-Cheng Liu, Hsinchu (TW); Dun-Nian Yaung, Taipei (TW); Volume Chien, Sinying (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 14/106,977

(22) Filed: Dec. 16, 2013

(65) Prior Publication Data

US 2014/0106498 A1    Apr. 17, 2014

Related U.S. Application Data

(62) Division of application No. 12/761,736, filed on Apr. 16, 2010, now Pat. No. 8,629,523.

(51) Int. Cl.
*H01L 31/0232* (2014.01)
*H01L 27/146* (2006.01)
*H01L 31/18* (2006.01)

(52) U.S. Cl.
CPC ...... *H01L 31/0232* (2013.01); *H01L 27/14629* (2013.01); *H01L 27/1464* (2013.01); *H01L 31/18* (2013.01)
USPC ..................................... 438/72; 257/E31.127

(58) Field of Classification Search
USPC ......... 257/431, 435, 436, 447, 460, 461, 462, 257/222, 225, 258, 239, E31.058, E31.063, 257/E31.115, E35.032, E27.133–E27.139; 438/72

See application file for complete search history.

(56) References Cited

U.S. PATENT DOCUMENTS

| | | |
|---|---|---|
| 2005/0007474 A1 | 1/2005 | Maeda |
| 2006/0086956 A1 | 4/2006 | Furukawa et al. |
| 2007/0257280 A1 | 11/2007 | Hynecek |
| 2009/0050947 A1 | 2/2009 | Dungan et al. |

(Continued)

OTHER PUBLICATIONS

Office Action dated Jul. 4, 2012 from corresponding application No. 201010279058.6.

*Primary Examiner* — Selim Ahmed
(74) *Attorney, Agent, or Firm* — Lowe Hauptman & Ham, LLP

(57) ABSTRACT

A method of creating a reflective shield for an image sensor device includes depositing a first dielectric layer on a substrate, wherein a photodiode is on the substrate. The method further includes removing surface topography by performing chemical mechanical polishing (CMP) on the first dielectric layer. The method further includes patterning the substrate to define an area on a surface of the first dielectric layer, wherein the area is directly above the photodiode. The method further includes depositing a layer of a material with high reflectivity on the substrate, wherein the material fills the area on the surface of the first dielectric layer. The method further includes removing excess material with high reflectivity, wherein the reflective shield is formed and is embedded in the first dielectric layer. The method further includes depositing a second dielectric material on the substrate, wherein the second dielectric material covers the reflective shield.

20 Claims, 13 Drawing Sheets

(56) References Cited

U.S. PATENT DOCUMENTS

2009/0194671 A1 8/2009 Nozaki et al.
2009/0302358 A1 12/2009 Mao et al.
2011/0049330 A1* 3/2011 Adkisson et al. .......... 250/208.1

* cited by examiner

METHOD OF MAKING A REFLECTIVE SHIELD

PRIORITY CLAIM

The present application is a divisional of U.S. application Ser. No. 12/761,736, filed Apr. 16, 2010, which is incorporated by reference herein in its entirety.

FIELD

The present disclosure relates generally to semiconductor devices, and more particularly, to image sensor devices.

BACKGROUND

Semiconductor image sensors are used for sensing radiation such as light. Complementary metal-oxide-semiconductor (CMOS) image sensors (CIS) and charge-coupled device (CCD) sensors are widely used in various applications such as digital still camera or mobile phone camera devices. These devices utilize an array of pixels in a substrate, including photodiodes and transistors that can absorb radiation projected toward the substrate and convert the sensed radiation into electrical signals. The demands of higher resolution and lower power consumption have encouraged further miniaturization and integration of these image sensors. It is within this context the following disclosure arises.

BRIEF DESCRIPTION OF THE DRAWINGS

The present disclosure will be readily understood by the following detailed description in conjunction with the accompanying drawings, and like reference numerals designate like structural elements.

DETAILED DESCRIPTION OF THE EXEMPLARY EMBODIMENTS

Figure 1:
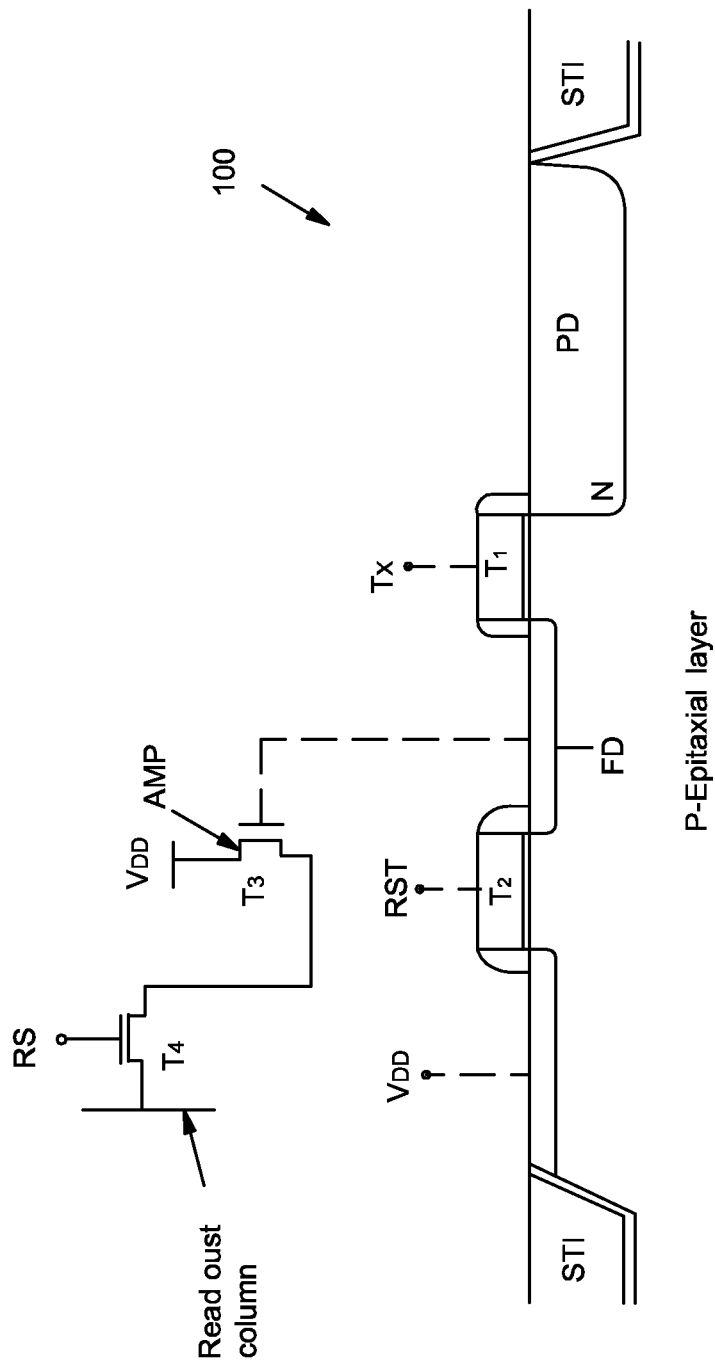
FIG. 1 shows a simplified cross-sectional view of an active pixel cell that uses four transistors, in accordance with some embodiments.

It is to be understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 shows a simplified cross-sectional view of an active pixel cell 100 that uses four transistors, in accordance with some embodiments. Such active pixel cell may also be called as a 4T pixel cell. 4T pixel cell 100 includes a photodiode PD, a transfer transistor T1, a reset transistor T2, a source-follower ("SF") or amplifier ("AMP") transistor T3, and a row select ("RS") transistor T4.

During operation, transfer transistor T1 receives a transfer signal TX, which transfers the charge accumulated in photodiode PD to a floating drain/diffusion node FD. Reset transistor T2 is coupled between a power rail VDD and the node FD to reset the pixel (e.g., discharge or charge the FD and the PD to a preset voltage) under control of a reset signal RST. The node FD is coupled to control the gate of AMP transistor T3. AMP transistor T3 is coupled between the power rail VDD and RS transistor T4. AMP transistor T3 operates as a source-follower providing a high impedance connection to the floating diffusion FD. Finally, RS transistor T4 selectively couples the output of the pixel circuitry to the readout column line under control of a signal RS. In some embodiments, the photodiode PD of a pixel cell is passivated with a shallow pinning layer (not shown) to reduce surface defects. In this example, an N type PD is implanted into a P-epitaxial layer, the pinning is formed by a shallow P type implant. Other types of photodiodes can also be used.

The demand for higher image quality, such as digital-still-camera-like (or DSC-like) quality for mobile applications, requires decreasing pixel size while maintaining full-well capacity, quantum efficiency, and sensitivity. To meet such demands becomes very challenging. With the decreased pixel size, the total absorption depth becomes insufficient for some light, especially for long-wavelength light, and for image sensors using backside illumination (BSI) technology. In some embodiments, the width of CIS using BSI is between about 0.1 µm and about 2 µm.

Figure 2:
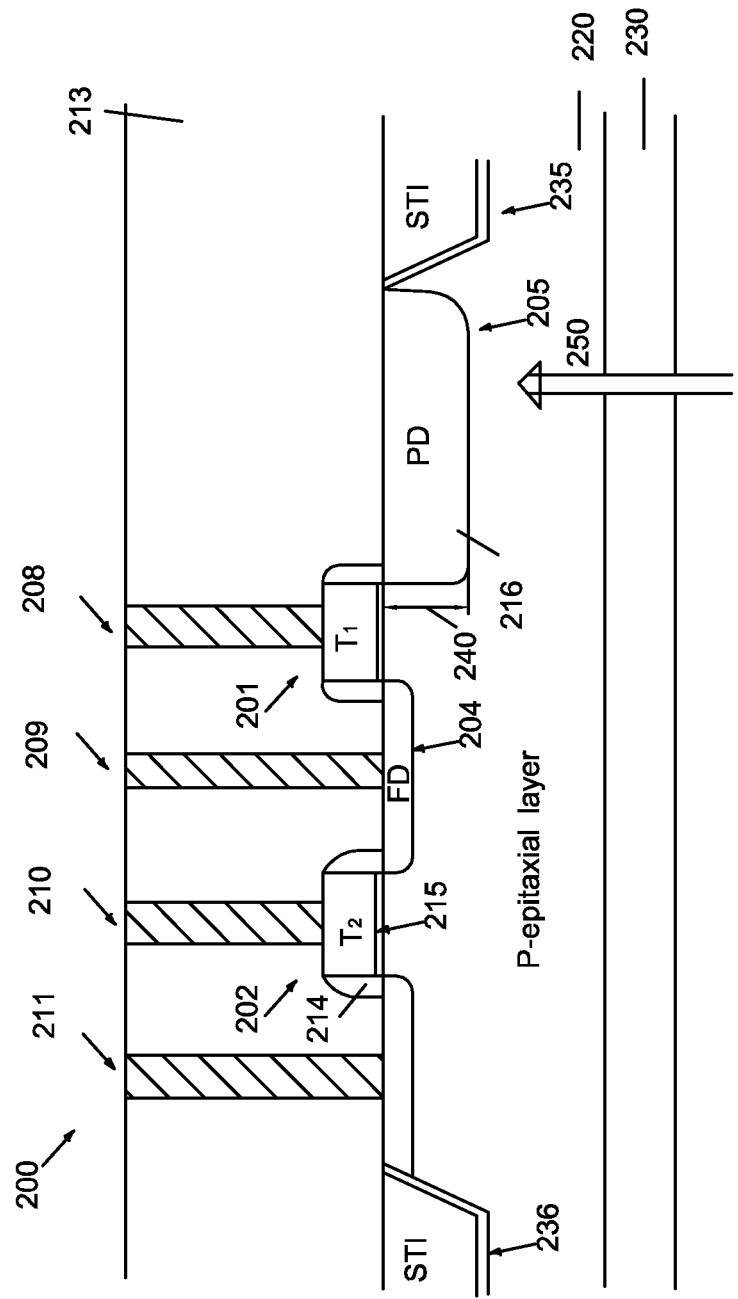
FIG. 2 shows a more detailed cross-sectional view of FIG. 1, in accordance with some embodiments.

FIG. 2 shows a more detailed cross-sectional view of FIG. 1, in accordance with some embodiments. FIG. 2 shows a gate 201 of transfer transistor T1, a gate 202 of reset transistor T2 and a photodiode 205 next to the gate 201 of transfer transistor T1. The transfer transistor T1 and the reset transistor T2 share a floating diffusion region (FD) 204 and the image sensor 200 is separated from other image sensors by shallow trench isolations 235 and 236. In some embodiments, each transistor, such as transistors T1 and T2, has a gate dielectric layer 215 and spacers 214. FIG. 2 shows that an N type doped layer 216 is implanted into a P-epitaxial layer 220. However, structures and methods for improving quantum efficiency described in this disclosure are not limited to the type of photodiodes described here. Other types of photodiodes, such as P-type photodiodes, can also be used. The pixel 200 is built on a substrate 230.

Figure 3A:
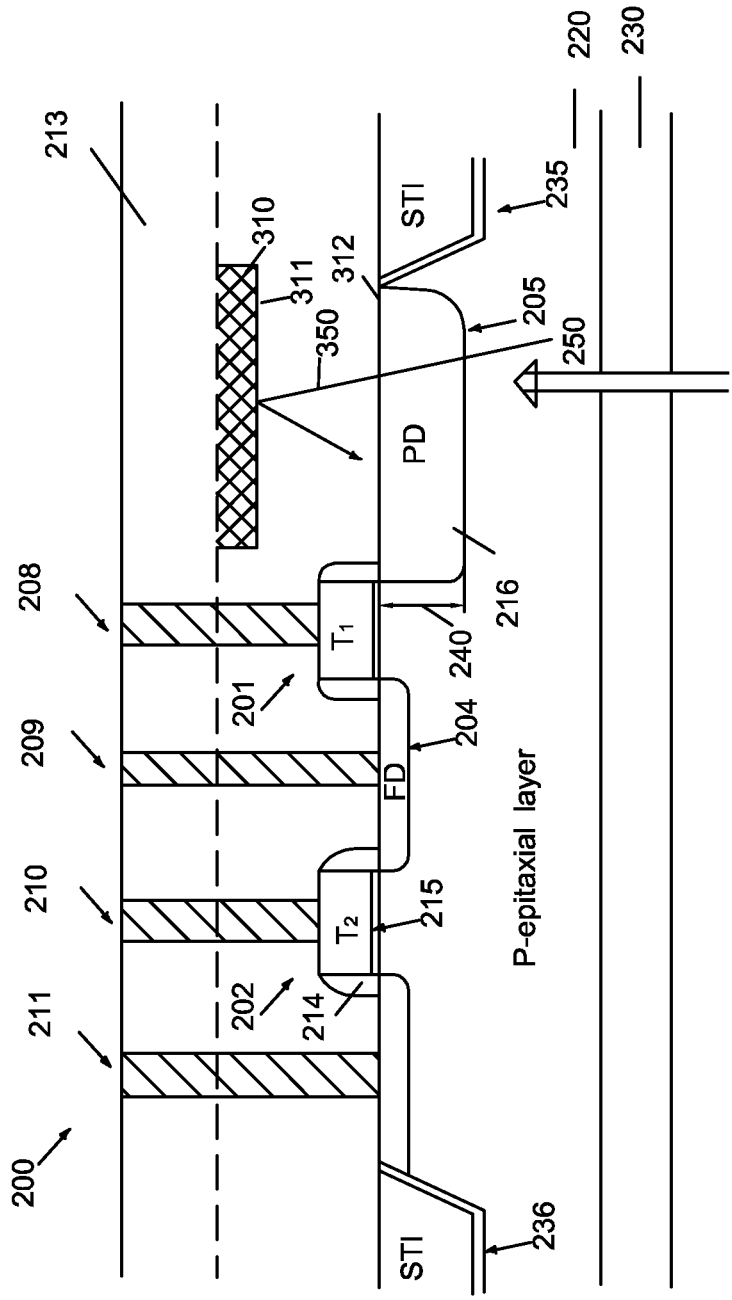
FIG. 3A shows an inserted reflective layer above the photodiode, in accordance with some embodiments.

There are contact plugs 208, 210, 209, and 211 above gate 201 of transfer transistor T1, gate 202 of reset transistor T2, diffusion region 204 and diffusion region 207 respectively to provide interconnection. The contact plugs 208, 210, 209, and 211 are surrounded by an inter-level dielectric (ILD) layer 213. Image sensor 200 receives photons 250 from the backside of substrate 230 (back side illumination), as shown in FIG. 2. Due to shrinking of the pixel size (or the size of image sensor 200, which is a pixel), the area of photodiode 205 has been decreased. As a result, the number of photons 250 that are available to hit the photodiode 205 have decreased. Therefore, higher absorption rate of impeding photons 250 is required. For backside illumination (BSI) technology, the total absorption depth 240 could be insufficient for long-wavelength rays, such as red light. FIG. 3A shows a reflective layer 310 (or a reflective shield) being inserted in the ILD layer 213 above the photodiode 205 to reflect the light that has passed photodiode 205 without being absorbed, in accordance with some embodiments. FIG. 3A shows that photon 350 has been reflected by a surface 311 of the reflective layer 310 and been redirected toward the photodiode 205. Photon 350 is one of photons 250 hitting photodiode 205 from the backside of substrate 230. The reflected photon 350 can be absorbed by the photodiode 205 when it travels through the absorption depth 240 of photodiode 205. The absorption length for photon 350 can be at least doubled due to the reflective layer 310. Therefore, the absorption efficiency (or quantum efficiency) is increased due to the insertion of the reflective layer (or shield) 310.

Figure 3B:
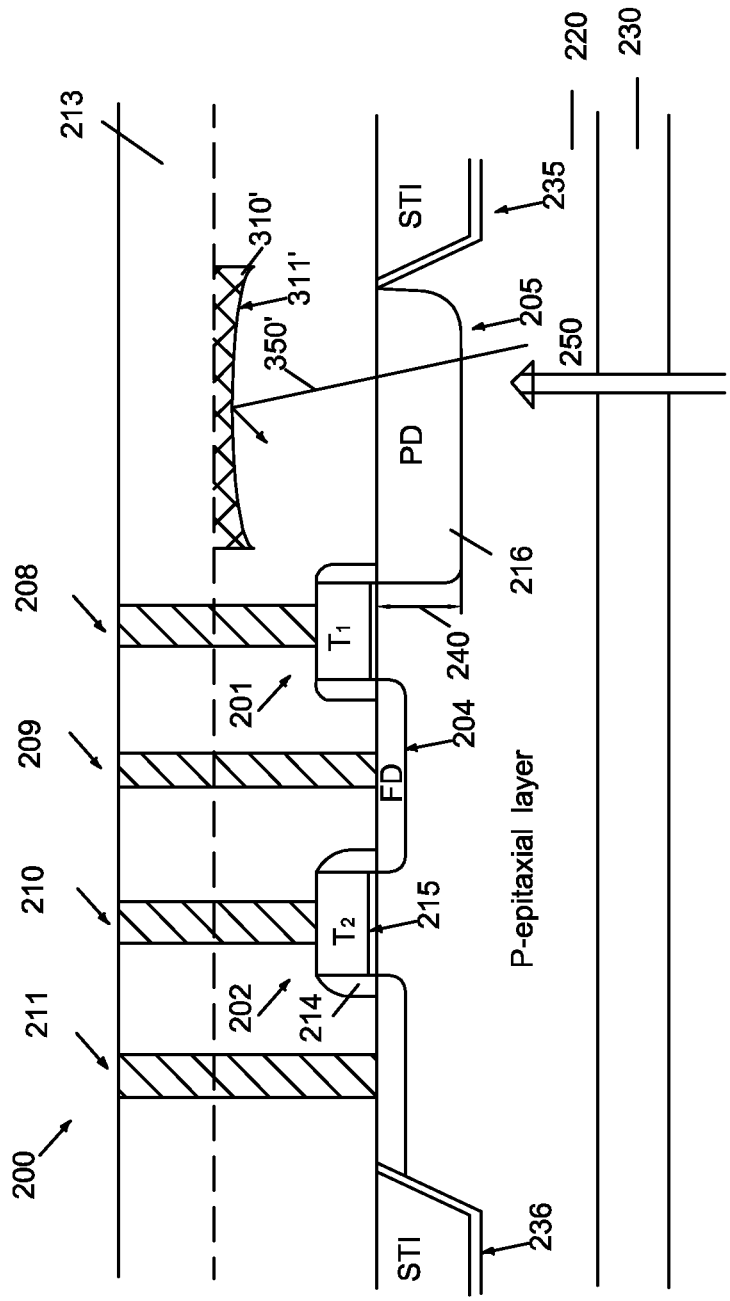
FIG. 3B shows a concave inserted reflective layer above the photodiode, in accordance with some embodiments.

The reflective layer 310 in FIG. 3A has a flat surface 311, which is parallel to the surface 312 of photodiode 205. Alternatively, the surface of the reflective layer 310 can be concave to direct the photons toward the photodiode 203. FIG. 3B shows a concave reflective layer 310' being inserted in the ILD layer 213 above the photodiode 205 to reflect the light that has passed photodiode 205 without being absorbed, in accordance with some embodiments. FIG. 3B shows that a photon 350' is reflected by a concave surface 311' of the reflective layer 310' and is redirected toward the center of photodiode 205. Since surface 311' is concave, surface 311' is able to direct light impeding the reflective layer 310' (or more precisely surface 311') at an angle θ that ranges between zero and substantially non-zero toward the photodiode 205.

Figure 3C:
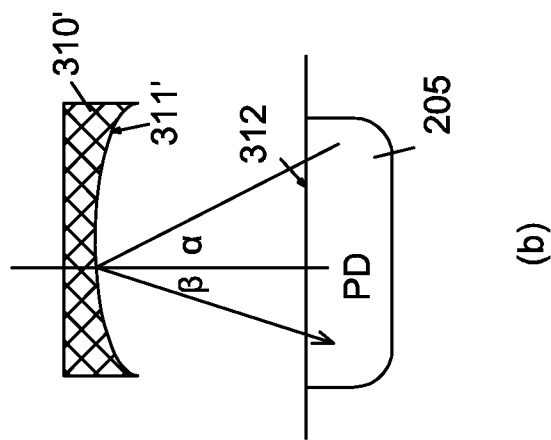
FIGS. 3C (a) and (b) show reflective layers being used to reflect light passing through photodiodes, in accordance with some embodiments.
Figure 3C:
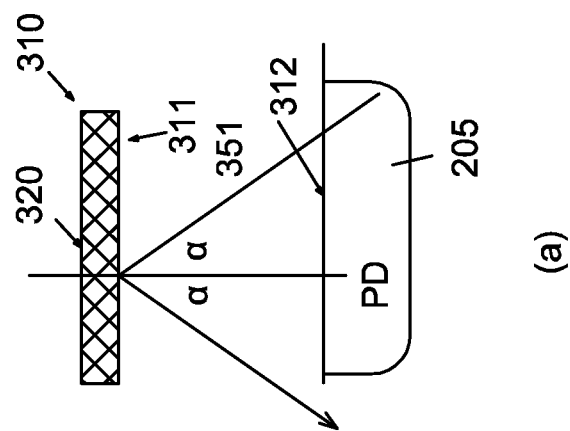

FIGS. 3C (a) and (b) show the two reflective layers 310 and 310' of FIGS. 3A and 3B respectively, in accordance with some embodiments. FIG. 3A (a) shows the reflective layer 310 having a flat surface 311 that faces and is parallel to the surface 312 of photodiode 205. When an impeding photon 351 arrives at the reflective layer 310 at an angle α, the photon is reflected off the surface 311 also at an angle α. The angle α ranges from zero to substantially non-zero (from the normal of surface 312). In the example shown in FIG. 3C (a), due to the location 320 and the angle α the photon 351 hits, the reflected photon 351 lands outside the surface 312 of photodiode 205 and cannot be absorbed by photodiode 205. However, when photon 351' hits a concave surface 311' of FIG. 3C (b) at an angle α from the normal of surface 312, the reflected photon 351' leaves concave surface 311' at an angle β to the normal of surface 312. Since angle β is smaller than angle α, due the concave surface 311', the photon 351' falls inside surface 312 of photodiode 205 and can be absorbed by photodiode 205. Concave surface 311' is capable of directing more photons arriving at the reflective layer that are not substantially perpendicular to the surfaces of the photodiodes (or arriving at a non-zero angle) toward the surface of photodiodes to be absorbed.

Figure 4A:
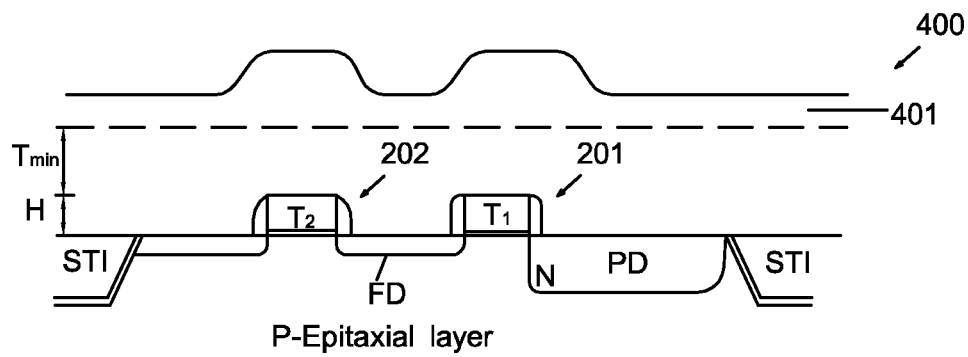
FIGS. 4A-4F illustrate structures and intermediate stages in a process flow for creating a reflective shield above a photodiode, in accordance with some embodiments.
Figure 4B:
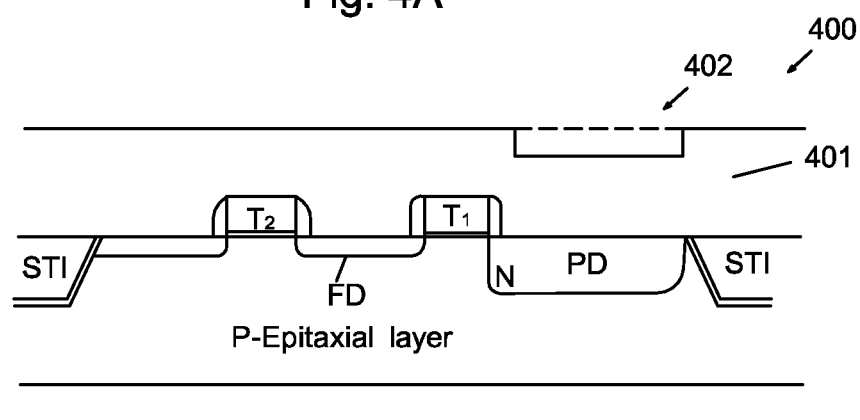

FIGS. 4A-4F illustrate structures and intermediate stages in a process flow for preparing an image sensor with an inserted reflective layer, in accordance with some embodiments. FIG. 4A shows that gate 201 and gate 202 have been prepared on a substrate 400, in accordance with some embodiments. As described above in FIGS. 1, 2, 3A and 3B, gate 201 is the transfer gate T1 and gate 202 is the reset gate T2. After the transistors T1 and T2 have been prepared, a first inter-level dielectric (ILD) layer 401 is deposited. The first ILD layer 401 can be made of any dielectric material, such as silicon dioxide (or undoped silicon glass USG), silicon nitride, or a combination of both films. The first ILD layer 401 may also be a doped dielectric film, such as BPSG (boron and phosphorous doped silicon glass) or PSG (phosphorous doped silicon glass), a low-dielectric-constant (low-K) material, such as fluorine-doped silicon glass (FSG) or other low-K materials used in semiconductor device manufacturing. One example of a material for the first ILD layer 401 is silicon oxide deposited by plasma enhanced chemical vapor deposition (PECVD) using TEOS (Tetraethyl orthosilicate) as the silicon source. PECVD silane oxide film can also be used. In some embodiments, the TEOS oxide has a thickness between about 3000 Å to about 15000 Å. The first ILD layer 401 does not need to be deposited by PECVD. The dielectric layer 101 can be a spin-on dielectric (SOD) or a spin-on glass (SOG). The first ILD layer 401 may also be deposited by high-density plasma chemical vapor deposition (HDPCVD), or sub-atmosphere chemical vapor deposition (SACVD). Other types of dielectric deposition processes may also be used.

The deposited ILD 401 has surface topography resulting from the structures on the substrate. In some embodiments, the surface topography is removed by chemical mechanical polishing (CMP), which has the capability of globally planarizing a substrate surface. The deposited ILD 401 has a minimal thickness of the height "H" of the gate structures, such as gates T1 and T2. In addition, a certain amount of ILD "$T_{min}$" needs to remain above the gate to ensure that polishing pad of CMP does not come in contact with any gate structures on the substrate to damage the gates. In some embodiments, $T_{min}$ is between about 100 Å and about 5000 Å. In some embodiments, the total thickness of H and $T_{min}$ is kept as small as possible to prevent absorption and/or diffraction of light in the ILD film, and to maintain the intensity of light reflected by the inserted reflective layer, such as layers 310 and 310' of FIGS. 2 and 3A-3C, to be formed.

Afterwards, the substrate is patterned and etched to create an opened area (or opening) 402 to deposit the reflective layer 310 described above, as shown in FIG. 4B in accordance with some embodiments. After opened area 402 is created, a reflective material (or a material with high reflectivity) is deposited on the substrate surface and fills the opened area 402. Reflectivity is defined as a fraction of impeding light being reflected. A reflective material can reflect a fraction (or percentage) of impeding light, such as 5%, 10%, 50% or 80%. The higher the reflectivity of the material, the higher percentage of the impeding light is reflected. Most of the metals have relatively high reflectivity. In some embodiments, the reflective materials for the applications described above are metals. Examples of reflective metals that can be used for such application include, but are not limited to, tungsten (W), aluminum (Al), and copper (Cu), zinc (Zn), gold (Au), silver (Ag), titanium (Ti), tantalum (Ta), chromium (Cr), tin (Sn), cobalt (Co), and nickel (Ni). The reflective material can also be a metal-containing film or an alloy that is made of two or more metals.

Figure 4C:
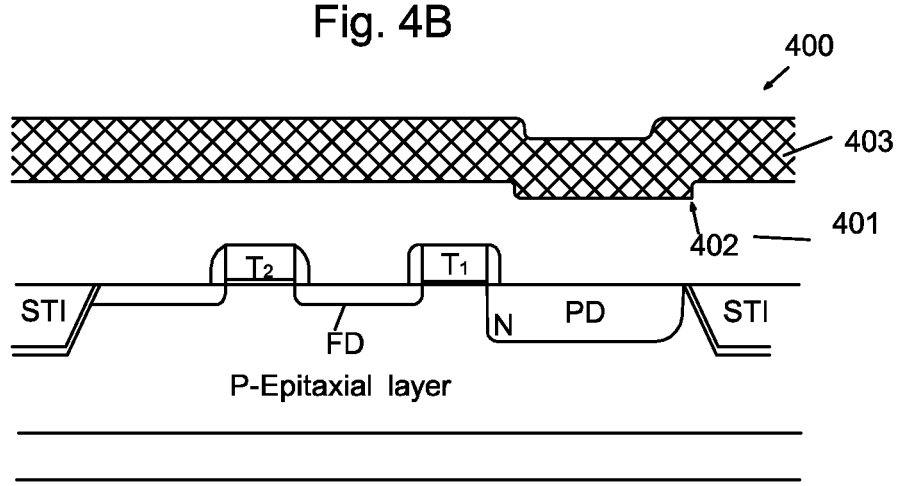

Non-metal (or non-metallic) materials that are reflective may also be used. For example, polytetrafluorethylene (PTFE) is a polymer that has high reflectivity. In some embodiments, an adhesion layer (or adhesion-promoting layer) (not shown here) is deposited under the reflective layer to promote adhesion between the reflective layer and ILD. For example, if the reflective layer 310 is made of W, an adhesion layer made of Ti, TiN, Ta, TaN, or a combination of the above-mentioned adhesion-promoting materials can be used. FIG. 4C shows a metal film 403, such as W, and an optional adhesive layer (not shown) deposited on the substrate, in accordance with one embodiment of this disclosure. The reflective material can be deposited by CVD, physical vapor deposition (PVD), atomic layer deposition (ALD), plating, spin-on or other applicable methods. For example, W can be deposited by CVD. Adhesion-promoting material for W, such as Ti and TiN, can be deposited by PVD in some embodiments. In some embodiments, the reflective material is selectively deposited in the opened area 402. In some embodiments, the metal film 403 deposited has a thickness between about 200 Å and about 5000 Å. In some embodiments, the adhesion layer deposited has a thickness between about 10 Å and about 500 Å.

Figure 4D:
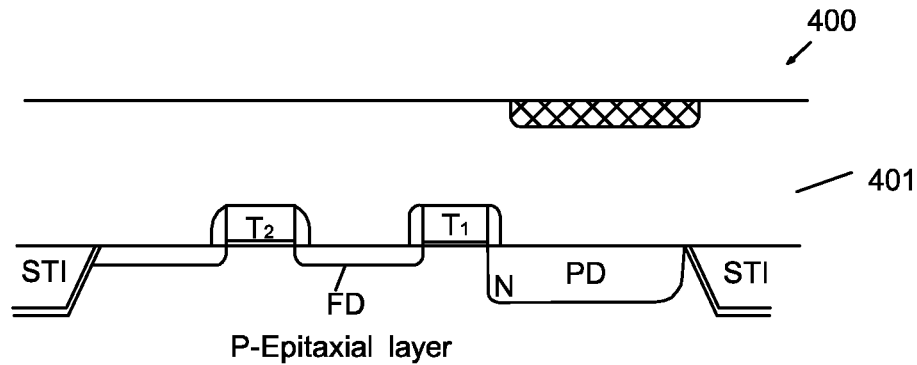

After the deposition of the reflective material, the excess reflective material on the substrate surface is removed, such as by CMP, and leaves only the reflective material only in opened area 402. CMP is not the only method that can be used to remove excess material. In some embodiments, the excess reflective material can be removed by etching process(es), which could be dry or wet. If an adhesion layer has been deposited under the reflective material, the adhesion layer not in the opened area 402 is also removed. FIG. 4D shows substrate 400 after the removal of reflective material from the substrate surface and leaves the reflective layer 310 (or reflective shield) on the substrate surface. In some embodiments, the thickness of reflective layer 310 is greater than about 200 Å. In some other embodiments, the thickness of reflective layer 310 is greater than about 500 Å. In yet other embodiments, the thickness of reflective layer 310 is between about 100 Å to about 2000 Å.

Figure 4E:
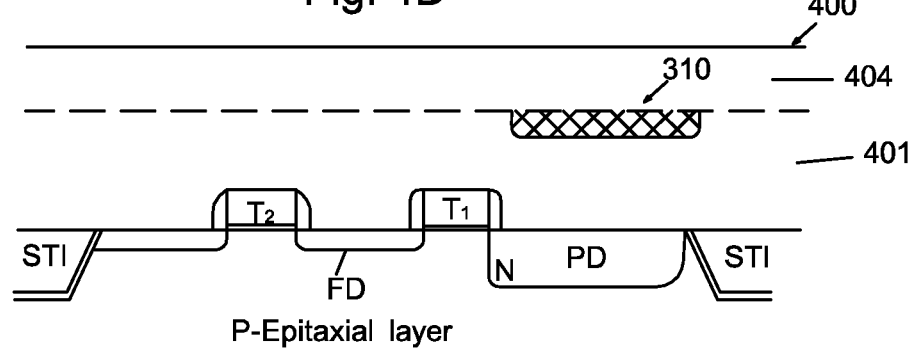
Figure 4F:
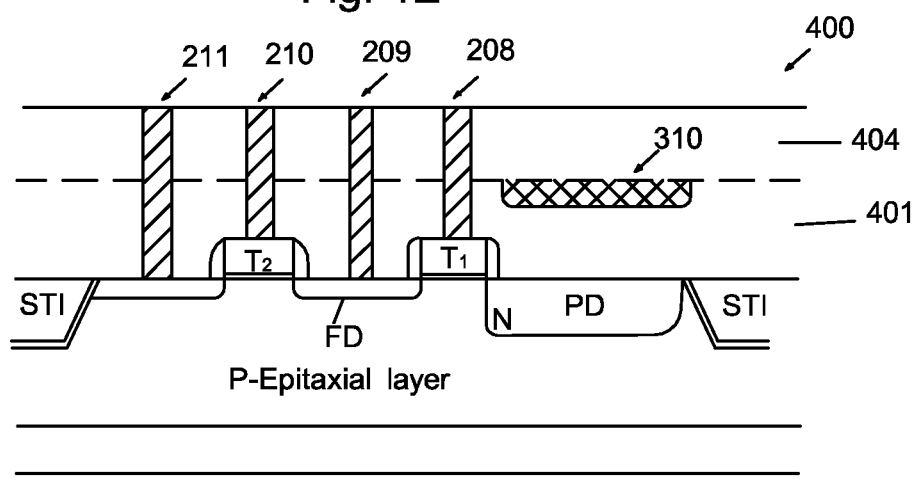

Afterwards, a second ILD layer 404 is deposited. The second ILD layer 404 can be made of the same material as ILD layer 401, or different material from ILD layer 401. The materials and deposition methods mentioned above for ILD layer 401 can be used for ILD layer 404. In one embodiment, the second ILD layer 404 is an oxide deposited from silane or TEOS, and has a thickness between about 500 Å and about 10000 Å. In another embodiment, the second ILD layer 404 has a thickness between about 1000 Å and about 5000 Å. FIG. 4E shows substrate 400 after the second ILD layer 404 is deposited, in accordance with one embodiment of this disclosure. The reflective layer 310 is sandwiched between the first ILD layer 401 and the second ILD layer 404. The first ILD layer 401 and the second ILD layer 404 make up a pre-metal dielectric layer (or PMD layer).

Figure 4G:
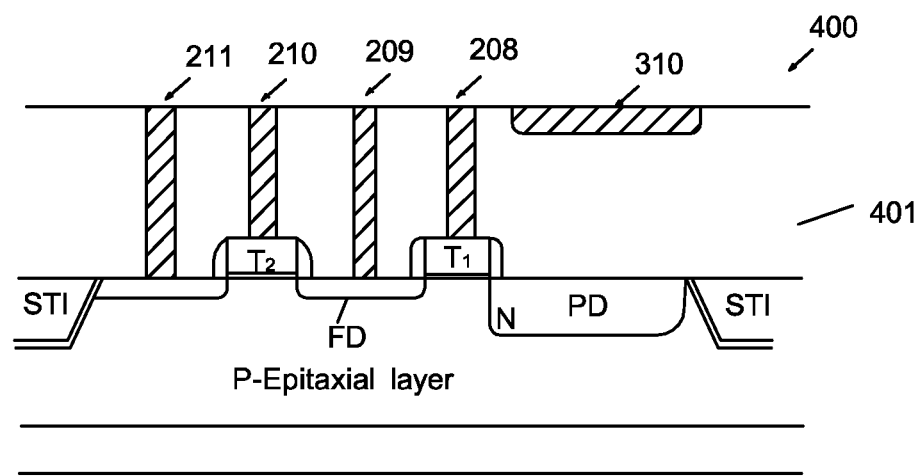
FIG. 4G shows a cross sectional diagram of an active pixel cell with the reflective layer 300 at the top surface of the PMD (pre-metal dielectric) layer, in accordance with some embodiments.

After the deposition of the second ILD layer 404, the substrate is patterned to create openings for contact plugs, such as plugs 208, 209, 210, and 211, and to fill such contact openings with adhesion layer and contact metal. In some embodiments, the contact metal is W and the adhesion layer is made of Ti, TiN, Ta, TaN, or a combination of the above-mentioned barrier materials. Additional processing operations, such as operations needed to establish additional levels of interconnection, are needed to complete the manufacturing of the image sensors on the substrate. In some embodiments, the second ILD layer 404 does not exist and the reflective layer 310 resides at the top surface (or interface) of the PMD layer. Under such circumstances, the contact plugs can be patterned right after or right before the opening 402 (the opening for the reflective layer) is created, in accordance with some embodiments. The adhesion layer and contact gap-fill layer can also be used to fill opening 402 (to create the reflective layer), in accordance with some embodiments. FIG. 4G shows a cross sectional diagram of an active pixel cell with the reflective layer 300 at the top surface of the PMD layer, in accordance with some embodiments. In FIG. 4G, the materials used to fill the contact plugs, such as the adhesion layer and the contact metal, are also used to create the reflective layer.

The embodiment of process flow described above in FIGS. 4A-4F can be used to create a reflective layer (or shield) to reflect light that is not absorbed by photodiodes back to photodiodes for additional absorption. The reflective layer (or shield) created has a flat surface facing the photodiode (or a surface parallel to the surface of the photodiode). As mentioned in FIGS. 3B and 3C, the surface of the reflective layer facing the photodiode can be concave to help direct reflected light toward the surface of the photodiode. FIGS. 5A-5J illustrate structures and intermediate stages in a process flow for preparing an image sensor with an inserted reflective layer, in accordance with some embodiments.

Figure 5A:
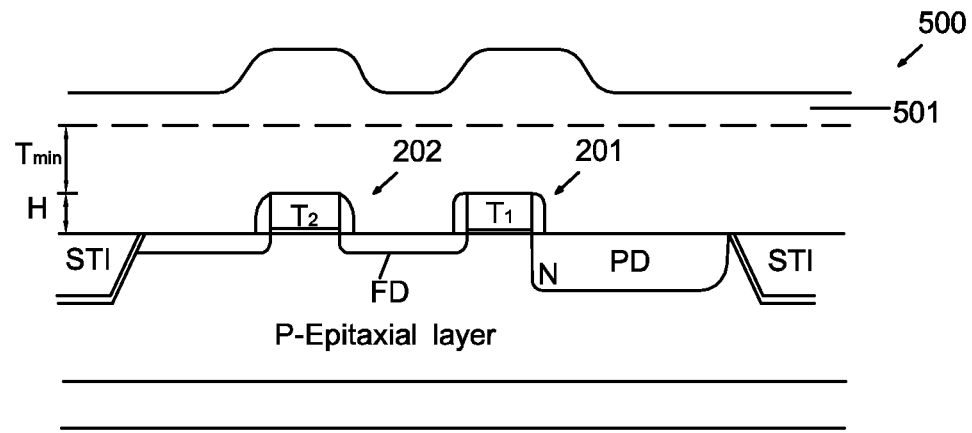
FIGS. 5A-5J illustrate structures and intermediate stages in a process flow for creating a concave reflective shield above a photodiode, in accordance with some embodiments.

FIG. 5A shows that gate 201 and gate 202 have been prepared on a substrate 500, in accordance with one or more embodiments. The gate structures T1 and T2 of FIG. 5A are similar to the gate structures T1 and T2 described in FIG. 4A-4F. As described above in FIG. 4A, after transistors T1 and T2 have been prepared, a first inter-level dielectric (ILD) layer 501 has been deposited. The possible materials and manufacturing methods for the first ILD layer 501 are similar to the materials and manufacturing methods of the first ILD layer 401.

The deposited ILD 501 has surface topography resulting from the structures on the substrate. The surface topography is removed by chemical mechanical polishing (CMP), in some embodiments. Similar to FIG. 4A, the deposited ILD 501 has a minimal thickness of the height "H" of the gate structures, such as gates T1 and T2. In addition, a certain amount of ILD "$T_{min}$" needs to remain above the gate to ensure that polishing pad of CMP does not come in contact with any gate structures on the substrate to damage the gates. In some embodiments, $T_{min}$ between about 100 Å and about 5000 Å. In one embodiment, the total thickness of H and $T_{min}$ is kept as small as possible to prevent absorption and/or diffraction of light in the ILD film, and to maintain the intensity of light reflected.

Figure 5B:
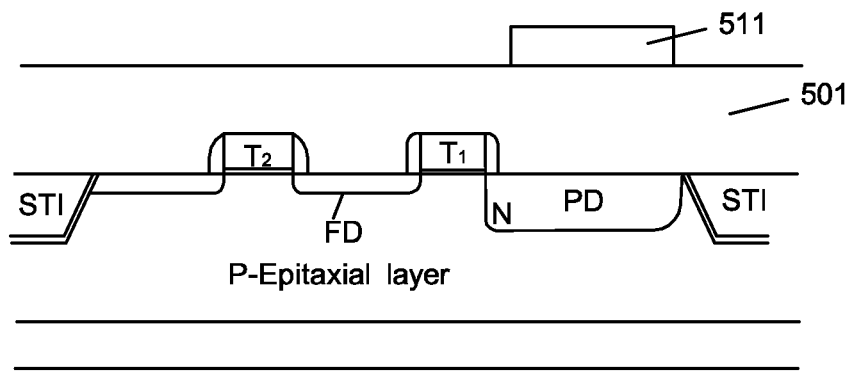
Figure 5C:
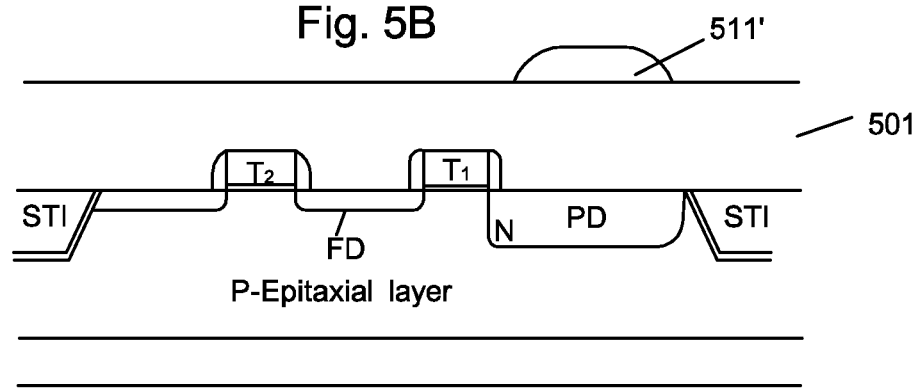

Afterwards, the substrate is patterned with a photoresist layer 511, as shown in FIG. 5B in accordance with some embodiments. The photoresist layer 511 is disposed over an area for creating the opened area (or opening, 502 in FIG. 5E described below). Photoresist layer 511 is treated to create a concave shape, as shown in FIG. 5C. In some embodiments, the treatment to create the concave-shaped photoresist 511' can be a low temperature reflow (or bake, or curing), at a temperature between about 100° C. to about 300° C. for a duration between 0.1 minutes and about 10 minutes. In some other embodiments, the treatment can be implanting molecules into the photoresist to harden the photoresist 511 of FIG. 5B.

Figure 5D:
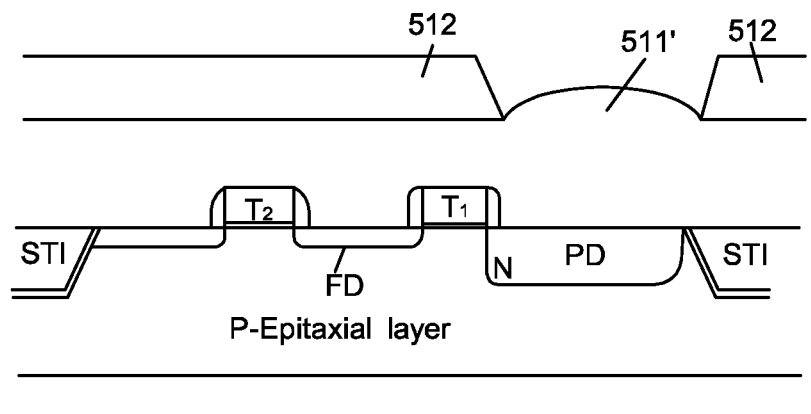
Figure 5E:
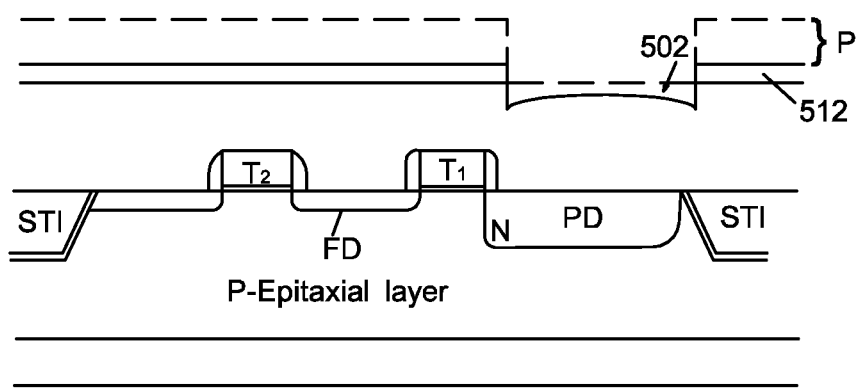
Figure 5F:
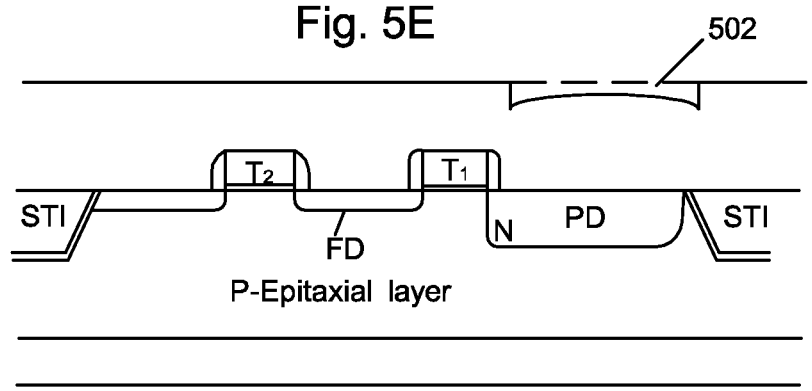

After the dome-shaped photoresist 511' is formed, another photoresist layer 512 is applied on the substrate and patterned to cover areas that are not covered by the dome-shaped photoresist 511', as shown in FIG. 5D in accordance with some embodiments. Afterwards, the dome-shaped photoresist 511', which has been hardened, is etched to leave a domed-shaped opening 502 in the first ILD layer 501, as shown in FIG. 5E in accordance with some embodiments. FIGS. 5D and 5E show that a portion "P" of photoresist layer 512 is removed during the etching of the dome-shaped photoresist 511' and the first ILD layer 510 under the dome-shaped photoresist 511'. Afterwards, the remaining photoresist layer 512 is removed, as shown in FIG. 5F in accordance with some embodiments.

Figure 5G:
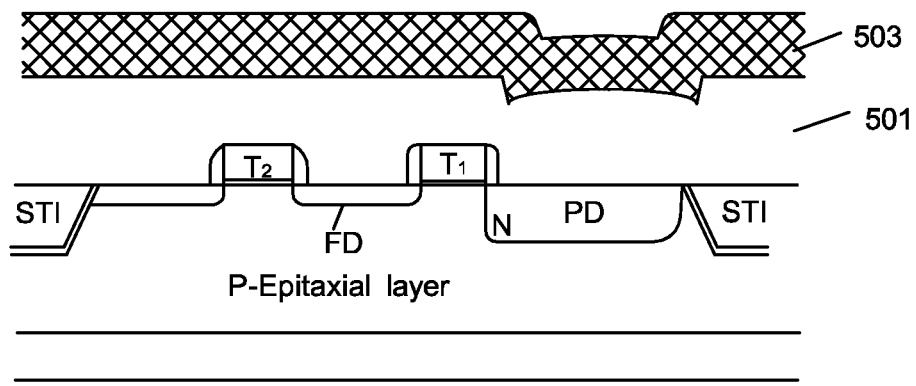

Following the removal of photoresist layer 512, a reflective material is deposited on the substrate surface and fills the opened area 502. The potential reflective materials and deposition methods that can be used for this application are similar to those described above for the application for flat reflective layer 310 of FIGS. 4C and 4D. FIG. 5G shows a metal layer 503, such as a W film, and an optional adhesive layer (not shown) deposited on the substrate, in accordance with some embodiments.

Figure 5H:
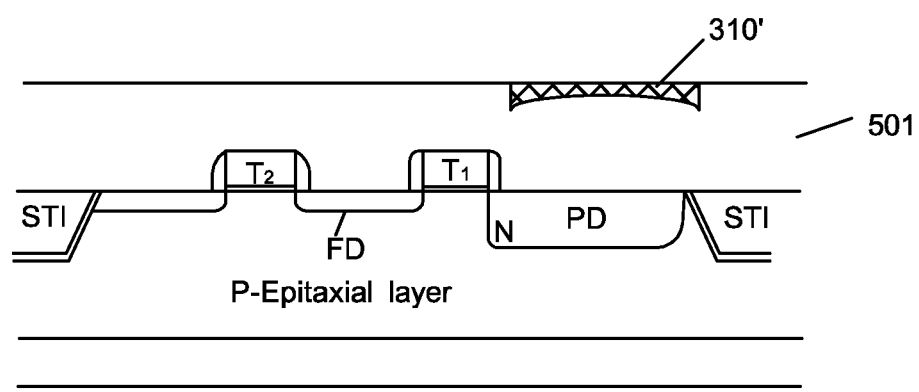

After the deposition of the reflective material, the excess reflective material on the substrate surface is removed, leaving only the reflective layer 310' in opened area 502. For example, if the reflective material is W, CMP can be used to remove the excess material. As mentioned above, CMP is not the only method that can be used to remove excess material. In some embodiments, the excess reflective material can be removed by etching process(es), which could be dry or wet. If an adhesion layer has been deposited under the reflective material, the adhesion layer not in the opened area 502 is also removed. FIG. 5H shows substrate 500 after the removal of reflective material from the substrate surface leaving the domed-shaped reflective layer 310' (or dome-shaped reflective shield) on the substrate surface. In some embodiments, the smallest thickness of reflective layer 310' is greater than about 200 Å. In some other embodiments, the smallest thickness of reflective layer 310 is greater than about 500 Å. In yet other embodiments, the thickness of reflective layer 310 is between about 100 Å and about 2000 Å.

Figure 5I:
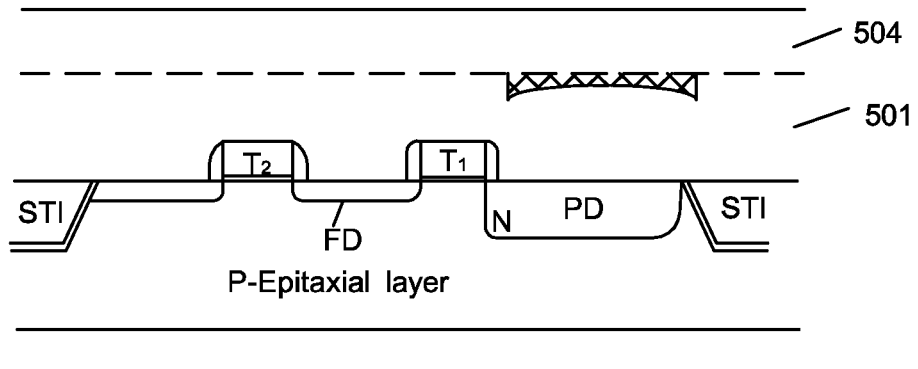
Figure 5J:
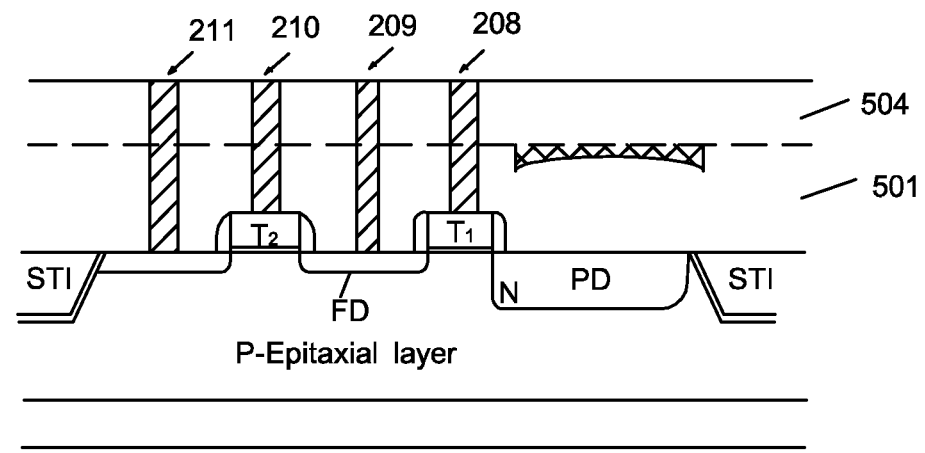

Afterwards, a second ILD layer 504 is deposited in accordance with some embodiments. The second ILD layer 504 can be made of the same or different material as ILD layer 501. The materials and deposition methods mentioned above for the first ILD layer 501 can be used for the second ILD layer 504. In some embodiments, the second ILD layer 404 is an oxide deposited from silane or TEOS, and has a thickness between about 500 Å and about 10000 Å. In another embodiment, the second ILD layer 504 has a thickness between about 1000 Å and about 5000 Å. FIG. 5I shows substrate 500 after the second ILD layer 504 is deposited, in accordance with some embodiments.

After the deposition of the second ILD layer 504, the substrate is patterned to create openings for contact plugs, such as plugs 208, 209, 210, and 211, and to fill such contact openings with adhesion layer and contact metal. In some embodiments, the contact metal is W and the adhesion layer is made of Ti, TiN, Ta, TaN, or a combination of the above-mentioned barrier materials. Additional processing operations, such as operations needed to establish additional levels of interconnection, are needed to complete the manufacturing of the image sensors on the substrate.

The various embodiments of methods described above are for creating the reflective layer (or shield), such as layer 310 or 310', for reflecting light that is not absorbed by the photodiodes back toward the photodiodes for additional absorption to increase the quantum efficiency of photodiodes. Ideally, the size of the reflective shield should cover the surface area of the photodiode and the photodiode's surrounding areas as much as possible to collect as much non-absorbed light to reflect back to the surface of the photodiode. However, since there are neighboring contact plugs, a minimal distance between reflective shield, such as shield 310 and 310' described above in FIGS. 2, 3A-3C, 4D-4F, and 5H-5J, and the neighboring contact plugs, such as plug 208 to prevent shorting between the two neighboring structures.

Figure 6A:
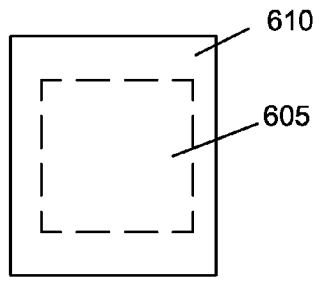
FIGS. 6A-6H illustrate top views of reflective shields above photodiodes, in accordance with some embodiments.
Figure 6B:
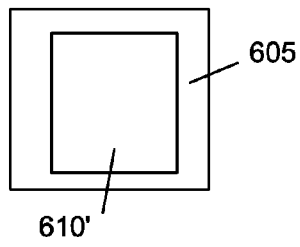
Figure 6C:
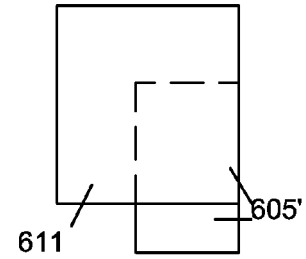

FIG. 6A shows a top view of a reflective shield (or layer) 610 covering a photodiode 605, in accordance with some embodiments. The photodiode 605 and the reflective shield 610 could be rectangular or square-shaped, in some embodiments. The photodiode 605 does not need to be rectangular, and can be other shapes. In FIG. 6A, the reflective shield 610 is larger than the photodiode 605 and covers the entire photodiode 605. In some embodiments, the reflective shield 610' is smaller than the photodiode 605, as shown in FIG. 6B. FIG. 6C shows a top view of a reflective shield 611 covering at least a portion of the photodiode 605', in accordance with some embodiments. The reflective shields 610' and 611 do not cover the entire photodiode 605 possibly due to structures (not shown) neighboring the edges 606 and 607 of the photodiode 605.

Figure 6D:
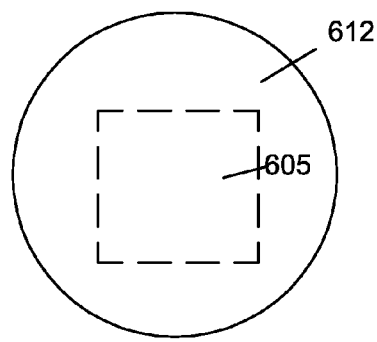
Figure 6E:
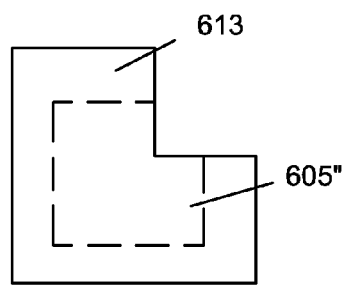

FIG. 6D shows a top view of a circular reflective shield 612 covering the photodiode 605, in accordance with some embodiments. In addition to circular and rectangular shapes, other shapes of reflective shields are also possible. FIG. 6E shows a top view of a reflective shield 613 covering a photodiode 605", in accordance with some embodiments. As mentioned above, the reflective shield and the photodiode can be in any shape. The reflective shield 613 and the photodiode 605' shown in FIG. 6E are not in rectangular shapes or in circular shapes. There is an opening in one corner of each structure.

Figure 6F:
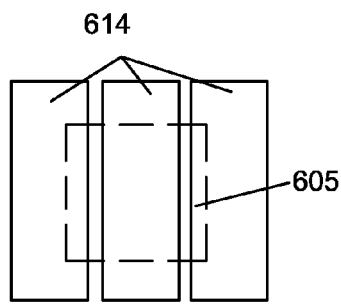
Figure 6G:
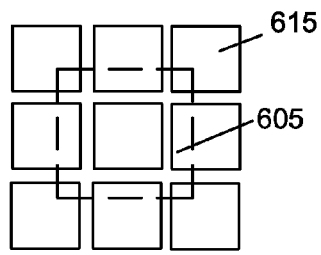
Figure 6H:
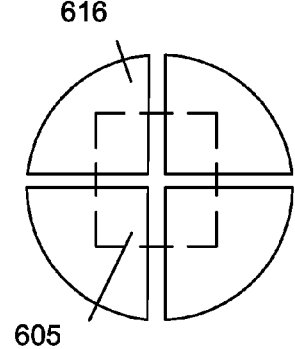

The reflective shields described above are all continuous pieces. In some embodiments, the reflective shields can be separated into smaller pieces with small openings between the pieces. There could be manufacturing concerns, such as dishing as a result of CMP, or electrical concerns that would require the reflective shields be divided into smaller pieces. FIGS. 6F, 6G, and 6H show various embodiments of reflective shields 614, 615, and 616 over the photodiode 605. In some embodiments, the space between the pieces is kept as small as possible to prevent light from going through the space without being reflected. In some embodiments, the space between the pieces is between about 0.01 μm and about 0.1 μm.

In some embodiments, the widths of reflective layers 310, 310' are between about 0.1 μm to about 5 μm. In some other embodiments, the widths of reflective layers 310, 310' are between about 0.5 μm and about 2.0 μm. In some embodiments, the lengths of reflective layers 310, 310' are between about 0.1 μm and about 10 μm. In some other embodiments, the widths of reflective layers 310, 310' are between about 0.5 μm and about 4.0 μm.

The structures of reflective shields and methods of making such structures described enable reflection of light that has not been absorbed by photodiodes in image sensor devices and increase quantum efficiency of the photodiodes. Such structures can be applied (or used) for any image sensors to improve image quality. Such structures are particular useful for image sensors with smaller pixel sizes and for long-wavelength light (or rays), whose absorption length (or depth) could be insufficient, especially for BSI devices. The reflective shields could double, or more than double, the absorption depth for light passing through the image sensors and getting reflected back to the photodiodes. Concave-shaped reflective shields have the additional advantage of directing reflected light toward the image sensors.

One aspect of this description relates to a method of creating a reflective shield for an image sensor device. The method includes depositing a first dielectric layer on a substrate, wherein a photodiode is on the substrate, and the first dielectric layer is in contact with the photodiode. The method further includes removing surface topography of the substrate by performing chemical mechanical polishing (CMP) on the first dielectric layer. The method further includes patterning the substrate to define an area on a surface of the first dielectric layer after CMP for the reflective shield, wherein the area defined for the reflective shield is directly above the photodiode. The method further includes depositing a layer of a material with high reflectivity on the substrate after patterning the substrate, wherein the material with high reflectivity fills the area on the surface of the first dielectric layer. The method further includes removing excess material with high reflectivity after the layer of the material with high reflectivity is deposited, wherein the reflective shield is formed and is embedded in the first dielectric layer. The method further includes depositing a second dielectric material on the substrate, wherein the second dielectric material covers the reflective shield.

Another aspect of this description relates to a method of creating a reflective shield for an image sensor device. The method includes forming a first dielectric layer on a substrate, wherein a photodiode is on the substrate, and the first dielectric layer is in contact with the photodiode. The method further includes patterning the first dielectric layer to define an area for the reflective shield, wherein the area defined for the reflective shield is directly above the photodiode, and the area comprises at least two sub-areas spaced apart from one another. The method further includes forming a high reflectivity layer on the substrate, wherein the high reflectivity layer fills the defined area, and the high reflectivity layer is embedded in the first dielectric layer. The method further includes forming a second dielectric material on the substrate, wherein the second dielectric material covers the high reflectivity layer.

Still another aspect of this description relates to a method of creating a reflective shield for an image sensor device. The method includes forming a first dielectric layer on a substrate, wherein a photodiode is on the substrate. The method further includes forming a photoresist material over an area of the first dielectric layer, wherein the area is directly over the photodiode. The method further includes treating the photoresist material to form a curved photoresist layer. The method further includes forming a curved opening in the first dielectric layer using the curved photoresist layer. The method further includes forming a high reflectivity layer on the substrate, wherein the high reflectivity layer fills the curved opening, wherein the high reflectivity layer includes at least two sub-areas spaced apart from one another.

Various modifications, changes, and variations apparent to those of skill in the art may be made in the arrangement, operation, and details of the methods and systems disclosed. Although the foregoing disclosure has been described in some detail for purposes of clarity of understanding, it will be apparent that certain changes and modifications may be practiced. Accordingly, the present embodiments are to be considered as illustrative and not restrictive, and the invention is not to be limited to the details given herein, but may be modified within the scope and equivalents of the disclosure.

What is claimed is:

1. A method of creating a reflective shield for an image sensor device, comprising:
    depositing a first dielectric layer on a substrate, wherein a photodiode is on the substrate, and the first dielectric layer is in contact with the photodiode;
    removing surface topography of the substrate by performing chemical mechanical polishing (CMP) on the first dielectric layer;
    patterning the substrate to define an area on a surface of the first dielectric layer after CMP for the reflective shield, wherein the area defined for the reflective shield is directly above the photodiode;
    depositing a layer of a material with high reflectivity on the substrate after patterning the substrate, wherein the material with high reflectivity fills the area on the surface of the first dielectric layer;
    removing excess material with high reflectivity after the layer of the material with high reflectivity is deposited, wherein the reflective shield is formed and is embedded in the first dielectric layer; and
    depositing a second dielectric material on the substrate, wherein the second dielectric material covers the reflective shield.

2. The method of claim 1, wherein the method further comprises forming contact plugs to transistors near the photodiode.

3. The method of claim 1, wherein patterning the substrate to define an area on a surface of the first dielectric layer includes patterning a first photoresist, etching the first dielectric layer not covered by the patterned first photoresist, and removing remaining portions of the first photoresist after etching the first dielectric layer.

4. The method of claim 1, wherein the material with high reflectivity is selected from a group consisting of tungsten (W), aluminum (Al), and copper (Cu), zinc (Zn, gold (Au), silver (Ag), titanium (Ti), tantalum (Ta), chromium (Cr), tin (Sn), cobalt (Co), nickel (Ni), and alloys made thereof.

5. The method of claim 1, wherein the layer of the material with high reflectivity deposited has a thickness between about 100 Å and about 2000 Å.

6. The method of claim 1, wherein an adhesion layer is deposited between the first dielectric layer and the layer of the material with high reflectivity, and wherein a thickness of the adhesion layer is between about 10 Å and about 500 Å.

7. The method of claim 1, wherein the first dielectric layer has a thickness between about 3000 Å and about 15000 Å.

8. The method of claim 3, further comprising:
    treating the first photoresist after the first photoresist is patterned to make the first photoresist become dome-shaped;
    patterning a second photoresist after the first photoresist is treated, wherein the second photoresist is patterned to cover areas not covered by the patterned first photoresist; and
    etching the substrate after the second photoresist is patterned, wherein an opening with a concave surface facing the photodiode is created in the first dielectric layer.

9. The method of claim 1, wherein the area defined for the reflective shield has a width between about 0.5 μm and about 2 μm.

10. The method of claim 1, wherein there is more than one area defined for the reflective shield above the photodiode.

11. The method of claim 1, wherein the reflective shield is adapted to reflect light coming from a back surface of the substrate that passes through the photodiode to re-enter the photodiode, and wherein the reflective shield increases an absorption length of the light and a quantum efficiency of the photodiode.

12. A method of creating a reflective shield for an image sensor device, the method comprising:
    forming a first dielectric layer on a substrate, wherein a photodiode (PD) is on the substrate, and the first dielectric layer is in contact with the photodiode;
    patterning the first dielectric layer to define an area for the reflective shield, wherein the area defined for the reflective shield is directly above the photodiode, and the area comprises at least two sub-areas spaced apart from one another;

forming a high reflectivity layer on the substrate, wherein the high reflectivity layer fills the defined area, and the high reflectivity layer is embedded in the first dielectric layer; and forming a second dielectric material on the substrate, wherein the second dielectric material covers the high reflectivity layer.

13. The method of claim 12, wherein forming the first dielectric layer comprises forming the first dielectric layer comprising at least one of silicon dioxide, undoped silicon glass (USG) or silicon nitride.

14. The method of claim 12, wherein forming the first dielectric layer comprises forming the first dielectric layer using plasma enhanced chemical vapor deposition (PECVD), a spin-on process, high-density plasma chemical vapor deposition (HDPCVD), or sub-atmosphere chemical vapor deposition (SACVD).

15. The method of claim 12, wherein forming the first dielectric layer comprises forming the first dielectric layer having a thickness over an active device on the substrate, and patterning the first dielectric layer comprises patterning the first dielectric layer having the thickness over the active device ranging from about 100 angstroms (Å) to about 5000 Å.

16. The method of claim 12, wherein patterning the first dielectric layer comprises:

forming a curved photoresist material over the defined area; and etching the curved photoresist material and the first dielectric layer.

17. The method of claim 16, wherein forming the curved photoresist material comprises:

forming a photoresist layer over the first dielectric layer;

removing the photoresist layer outside the defined area; and treating the photoresist layer in the defined area to form the curved photoresist material.

18. The method of claim 17, wherein treating the photoresist layer comprises heating the photoresist layer at a temperature ranging from about 100° C. to about 300° C. for a duration ranging from about 0.1 minutes to about 10 minutes.

19. A method of creating a reflective shield for an image sensor device, the method comprising:

forming a first dielectric layer on a substrate, wherein a photodiode (PD) is on the substrate;

forming a photoresist material over an area of the first dielectric layer, wherein the area is directly over the photodiode;

treating the photoresist material to form a curved photoresist layer;

forming a curved opening in the first dielectric layer using the curved photoresist layer; and forming a high reflectivity layer on the substrate, wherein the high reflectivity layer fills the curved opening, wherein the high reflectivity layer includes at least two sub-areas spaced apart from one another.

20. The method of claim 19, wherein treating the photoresist layer comprises heating the photoresist layer at a temperature ranging from about 100° C. to about 300° C. for a duration ranging from about 0.1 minutes to about 10 minutes.

* * * * *